United States Patent
Lai et al.

(10) Patent No.: US 7,812,639 B2
(45) Date of Patent: Oct. 12, 2010

(54) EXTENDING DRIVE CAPABILITY IN INTEGRATED CIRCUITS UTILIZING PROGRAMMABLE-VOLTAGE OUTPUT CIRCUITS

(75) Inventors: Po-Shen Lai, San Jose, CA (US); Vaibhavi Sabharanjak, Fremont, CA (US); Ralph Heron, Morgan Hill, CA (US); Lakhdar Iguelmamene, San Jose, CA (US)

(73) Assignee: SanDisk CorporationCA (US)

( * ) Notice: Subject to any disclaimer, the term of this patent is extended or adjusted under 35 U.S.C. 154(b) by 0 days.

(21) Appl. No.: 11/967,885

(22) Filed: Dec. 31, 2007

(65) Prior Publication Data

US 2009/0167357 A1    Jul. 2, 2009

(51) Int. Cl.
*H03K 19/094* (2006.01)
(52) U.S. Cl. .............................. 326/86; 326/30; 326/33; 327/108
(58) Field of Classification Search .................... 326/30, 326/83, 86, 87
See application file for complete search history.

(56) References Cited

U.S. PATENT DOCUMENTS

| | | | |
|---|---|---|---|
| 5,337,254 | A | 8/1994 | Knee et al. |
| 5,663,664 | A | 9/1997 | Schnizlein |
| 5,974,476 | A | 10/1999 | Lin et al. |
| 6,043,683 | A | 3/2000 | Bae |
| 6,163,178 | A | 12/2000 | Stark et al. |
| 6,496,033 | B2 | 12/2002 | Rees |
| 6,624,662 | B1 | 9/2003 | Volk |
| 6,807,650 | B2 | 10/2004 | Lamb et al. |
| 6,909,308 | B2 | 6/2005 | Hunt |
| 6,956,403 | B2 | 10/2005 | Janssen |
| 7,019,553 | B2 | 3/2006 | Blodgett et al. |
| 7,080,341 | B2 | 7/2006 | Eisenstadt et al. |
| 7,205,786 | B2 | 4/2007 | Ahmad |
| 2004/0017220 | A1 | 1/2004 | To et al. |
| 2005/0194991 | A1* | 9/2005 | Dour et al. ..................... 326/30 |
| 2006/0114017 | A1* | 6/2006 | El-Kik et al. ................. 326/32 |
| 2007/0152712 | A1 | 7/2007 | Jun |

OTHER PUBLICATIONS

Rich Howell, "*Power Management: Ramp Rate Control with a Mixed-Signal FPGA*", ECN Asia Mag.com, copyright 2007, date unknown, www.ecnasiamag.com.

"*Aragio Solutions Offers Suite of Programmable GPIO I/O Libraries Supporting 65nm Common Platform Technology Available for Chartered Customers*", D & R Headline News, Nov. 5, 2007, www.us-design-reuse.com.

(Continued)

*Primary Examiner*—Rexford N Barnie
*Assistant Examiner*—Jany Tran
(74) *Attorney, Agent, or Firm*—Patterson Thuente Christensen Pedersen, P.A.

(57) ABSTRACT

An integrated circuit (IC) includes an output driver circuit portion that is electrically configurable, via a configuration input, to operate in either a first mode or a second mode corresponding to an indication of a condition of the IC, such as a supply voltage indication, the first mode and the second mode having different drive characteristics. A configuration interface circuit portion as part of the improved IC is adapted to selectively override the configuration input to configure operation of the output driver circuit portion in either the first mode or the second mode based on a drive strength control input, regardless of the condition of the IC.

18 Claims, 4 Drawing Sheets

OTHER PUBLICATIONS

Carlos Nieves, "*FPGA Solutions: New Low-Cost FPGAs for System Integration*", The Syndicated: A Technical Newsletter for ASIC and FPGA Designers. Synplicity, Inc. Sunnyvale, CA. 2004.

"*DDR2 Memory Interface Termination, Drive Strength and Loading Design Guidelines*" Drive Strength. pp. 25-30. Feb. 2007. Altera Corporation.

International Search Report for International Application No: PCT/US2008/087455 dated Jul. 30, 2009.

"*Aragio Solutions Offers Suite of Programmable GPIO I/O Libraries Supporting 65nm Common Platform Technology Available for Chartered Customers*", D & R Headline News. www.us-design-reuse.com, Nov. 2007.

Notification Concerning Transmittal of the International Preliminary Report on Patentability, International Application No. PCT/US2008/087455, 2 pages, mailed Jul. 15, 2010.

\* cited by examiner

EXTENDING DRIVE CAPABILITY IN INTEGRATED CIRCUITS UTILIZING PROGRAMMABLE-VOLTAGE OUTPUT CIRCUITS

FIELD OF THE INVENTION

The invention relates generally to integrated circuits (ICs) and IC design and, more particularly, to ICs that utilize pre-designed programmable output cells.

BACKGROUND OF THE INVENTION

Designers of integrated circuits such as application specific integrated circuits (ASICs) face growing market pressure to design and deliver their products to customers rapidly. Increasingly, IC manufacturers do not have time to design, evaluate, manufacture, and qualify every sub-circuit of their ICs to customer requirements. Accordingly, they rely on third-party suppliers of sub-circuit designs and layouts. Rights to use such third-party circuitry are typically acquired through licensing of the intellectual property to the sub-circuits from the third-party suppliers.

Third-party IC sub-circuits provide many advantages over in-house custom sub-circuit designs. For example, an input or output (I/O) cell that provides the function of interfacing the IC to an external circuit typically needs to meet certain requirements, such as industry standards (e.g., USB 2.0, IEEE 1394, IEEE 802.3, etc.) or specific performance requirements from a customer. IC manufacturers may not have the expertise or the opportunity to develop such an I/O cell with sufficiently fast time-to-market. Indeed, development of a customized I/O cell requires substantial cost, time, and effort. A third-party I/O cell may have already been developed, tested, and fully qualified to meet the industry standard or to perform according to a range of specifications that includes the customer requirements.

Recognizing that IC manufacturers may have specific performance requirements, third-party suppliers of I/O cells typically provide a limited set of pre-defined programmable or otherwise adjustable performance settings for their I/O cells. For example, a certain I/O cell design includes pre-defined adjustments for operating voltage, drive strength, slew rate, and the like.

IC designers are sometimes confronted with the challenge of having to deliver an IC having I/O cell performance that is outside the standard or adjustable range provided by certain third-party I/O cells. One particular challenge faced by IC manufacturers is providing an I/O cell with increased drive strength, or decreased drive strength, beyond the drive strength available in the I/O cell. Even when the IC manufacturer has rights to an I/O cell with a configurable drive strength setting, the need for configuring the drive strength beyond the available range of drive strength settings may nevertheless exist. Increased drive strength may be needed to drive greater loads or to meet stringent signal timing requirements. Decreased drive strength may be called for when the reactance of the load on the driver circuit is such that rapid signal transitions result in voltage overshoot or undershoot, such as ringing.

Modifying the I/O cell design to meet expanded operating range requirements may not be practicable, or may be prohibited under the applicable intellectual property licensing agreement. Selecting a different third party I/O cell to satisfy needs for an expanded drive strength range may involve having to take on the cost of an additional license for rights to use that I/O cell.

A solution is needed for expanding the range of drive strength settings of certain output circuits without having to undertake the burden of selecting different I/O cells or re-designing the output circuits themselves.

SUMMARY OF THE INVENTION

One aspect of the invention is directed to an improved IC that includes an output driver circuit portion that is electrically configurable, via a configuration input, to operate in either a first mode or in a second mode corresponding to an indication of a condition of the IC. The first mode and the second mode have different drive characteristics. In various embodiments, the indication of the condition of the IC can be a power supply voltage indication. The improvement includes a configuration interface circuit portion that is adapted to selectively override the configuration input to configure operation of the output driver circuit portion in either the first mode or the second mode based on a drive strength control input regardless of the indication of the condition of the IC.

Aspects of the invention recognize that, in certain third-party or other pre-designed output driver circuit portions or I/O cells of an IC that selectively support operation at multiple voltages, such as 3.3 V and 1.8 V, setting the output driver consistent with operation at one voltage or another voltage tends to also affect the output driver's drive characteristics. This tendency is exploited in various embodiments of the invention as a mechanism for configuring the output driver's drive strength. This approach is useful even with certain output driver circuits that support adjustment of the output driver's drive strength. In some of those cases, the range of output drive strength can be extended beyond the maximum and minimum drive strength settings available via the direct drive strength adjustment.

An IC having an output line configured for maximum drive strength according to one aspect of the invention includes an output driver circuit portion that is selectively configurable, via a voltage control configuration node, to operate in a first mode corresponding to a relatively lower supply voltage and in a second mode corresponding to a relatively higher supply voltage, the first mode and the second mode having different drive characteristics. A voltage control circuit selectively configures the output driver circuit portion via an output to the voltage control configuration node for operation in the first mode or in the second mode based on a supply voltage for the IC. An override circuit is electrically coupled to the voltage control configuration node, the override circuit causing the output driver circuit portion to be configured for operation in the first mode regardless of the output of the voltage control circuit to the voltage control configuration node.

In an IC having an output line configured for minimum drive strength according to that aspect of the invention, the override circuit causes the output driver circuit portion to be configured for operation in the second mode regardless of the output of the voltage control circuit to the voltage control configuration node.

Another aspect of the invention is directed to a method for configuring a drive strength of an output driver circuit portion of an IC having an output driver circuit portion that is electrically configurable to operate in a first mode corresponding to a first IC condition and in a second mode corresponding to a second IC condition, the first mode and the second mode having different drive characteristics, a method for configuring a drive strength of the output driver circuit portion. The method includes electrically configuring the output driver circuit portion to preferentially operate in either the first mode or the second mode regardless of whether the IC is in the first IC condition or the second IC condition, wherein the electrically configuring is based on a desired drive strength for the output driver circuit portion.

Advantageously, embodiments of the invention facilitate achieving drive strengths that are unavailable with conventional configuration of the output driver circuits or I/O cells to which the techniques apply. These extended drive strengths are made available without having to redesign or replace the driver circuit itself, saving significant time and expense for development of modifications to the driver circuits, and saving and intellectual property licensing costs for replacement driver circuits from third-party licensors. A number of other advantages will become apparent from the following Detailed Description of the Preferred Embodiments.

BRIEF DESCRIPTION OF THE DRAWINGS

The invention may be more completely understood in consideration of the following detailed description of various embodiments of the invention in connection with the accompanying drawings, in which.

Figure 1:
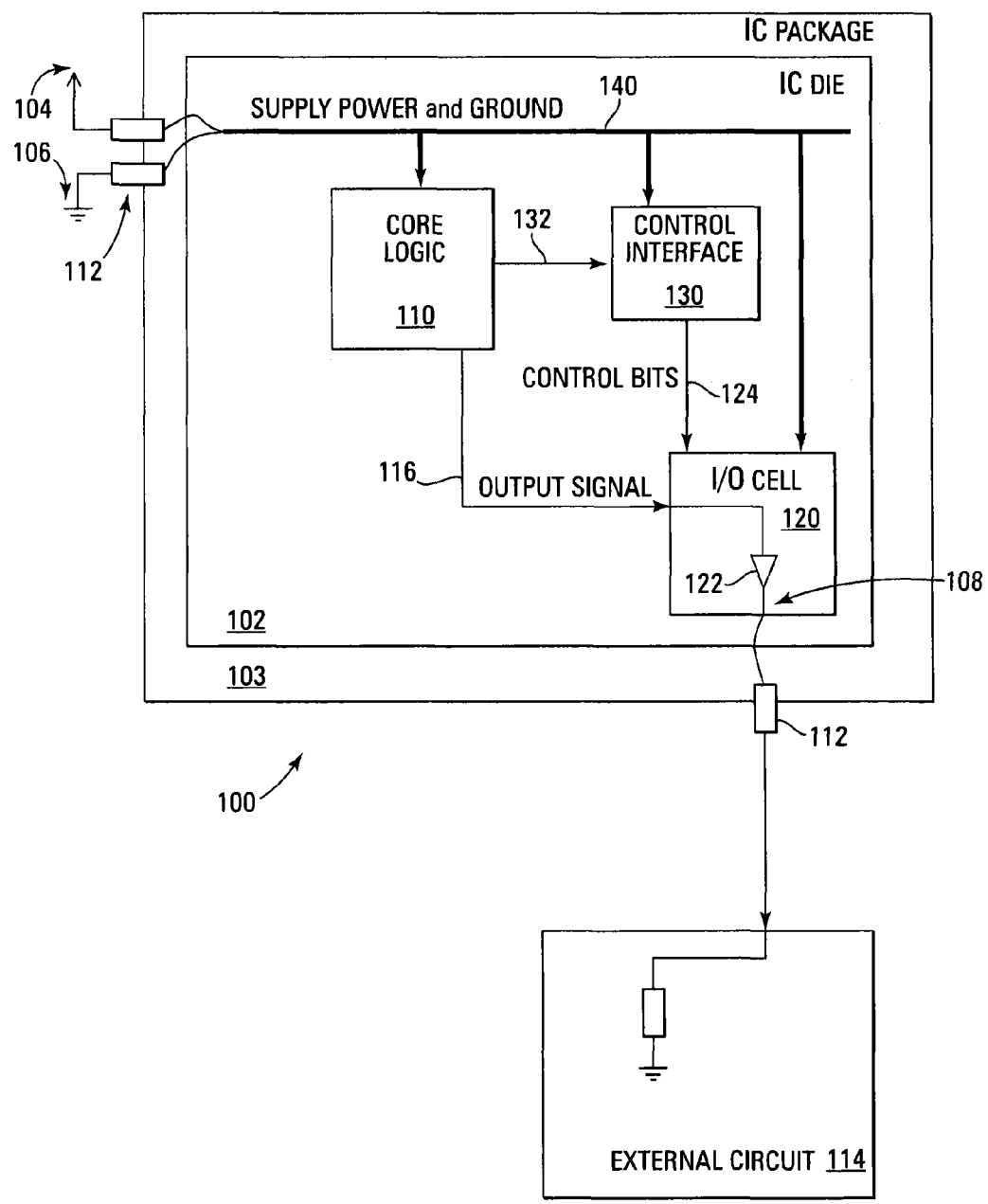
FIG. 1 is a block diagram illustrating a portion of exemplary IC 100 including an input or output (I/O) cell and an I/O cell control interface according to aspects of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENTS

Aspects of the invention are directed to integrated circuit (IC) devices and their manufacture. Persons skilled in the relevant arts should appreciate that aspects of the invention will apply to a wide variety of IC technologies without limitation to the examples described herein. Examples of IC technologies include ICs utilizing digital electronics, analog electronics, and mixed signal technologies, as well as hybrid devices that include passive components. The IC technologies can be based on any suitable semiconductor technology, such as, for example, silicon, gallium arsenide, etc., or any combination thereof, and on any suitable device technology such as, for example, CMOS, TTL, ECL, and the like, or any combination thereof. IC products can also include any type of functionality such as, without limitation, memory (e.g., RAM, ROM, PROM, EEPROM, etc.), logic family, programmable logic (e.g., PAL, PLA, FPGA, etc.), microprocessor/microcontroller, amplifier or signal conditioning circuitry, filters, interface circuitry, analog-to-digital, digital-to-analog, power supply circuitry, radio frequency and microwave devices, application specific integrated circuit (ASIC), microelectromechanical systems (MEMS), and the like.

FIG. 1 is a block diagram illustrating a portion of exemplary IC 100. IC 100 includes a die 102 having semiconductor devices and other structures formed thereupon and arranged as various sub-circuits including core logic 110, input or output (I/O) cell 120, I/O cell control interface 130, and power and ground conductors 140. Power and ground conductors 140 facilitate power delivery from supply power 104 and ground 106 the circuitry on die 102. In a related embodiment (not shown) die 102 includes power regulator circuitry that can supply power at certain voltages to the various sub-circuits.

IC package 103 encapsulates die 102 and provides electrical connections to supply power 104, ground 106, and to an output node 108 on die 102 via pins 112. Output node 108 is connected via a corresponding pin 112 to external circuit 114 that is external to IC 100.

Output signals from core logic 110, such signals carried by output signal path 116, are interfaced with external circuit 114 via I/O cell 120, which includes an output driver circuit portion 122. In various embodiments, I/O cell 120 can include an input circuit portion in addition to an output circuit portion. Also in various embodiments, I/O cell 120 can be configurable to operate according to various predetermined modes of operation via control bits 124. Examples of the various predetermined modes of operation for output driver circuit portion 122 include, without limitation, various drive strength settings, various slew rate settings, various waveshaping settings, various operating modes optimized for different power supply voltages, and various operating mode settings optimized for different device temperatures.

I/O cell control interface 130 configures I/O cell 120 via control bits 124 based on configuration settings 132 provided by core logic 110, or based on other configuration settings stored in I/O cell control interface 130 or elsewhere. In a related embodiment, I/O cell control interface 130 includes a programmable circuit, such as a ROM, a FPGA, an EEPROM, fuses or antifuses, and the like, in which at least a portion of the configuration settings may be stored. I/O cell control interface 130 can also include decision logic that defines the values of control bits 124 based on various combinations of conditions and settings related to IC 100. In various embodiments, I/O cell control interface 130 can provide configuration settings for a single I/O cell, or for groups of related I/O cells.

In a related embodiment, I/O cell control interface 130 determines the appropriate control bit values based on circuitry that senses certain logical or analog states, or other condition of IC 100. For instance, in one example embodiment, I/O cell control interface 130 senses the voltage of supply power 104 or of an output of a voltage regulator present on die 102, and configures I/O cell 120 to operate in a mode of operation corresponding to that voltage level. In another example embodiment, I/O cell control interface 130 includes a temperature sensing device, and configures I/O cell 120 to operate in certain modes based on the indication of temperature provided by the temperature sensing device. Another example of a condition of IC 100 upon which configuration of I/O cell 120 may be set by I/O cell control interface 130 is a state of an input node driven by an external circuit such as external circuit 114.

Figure 2:
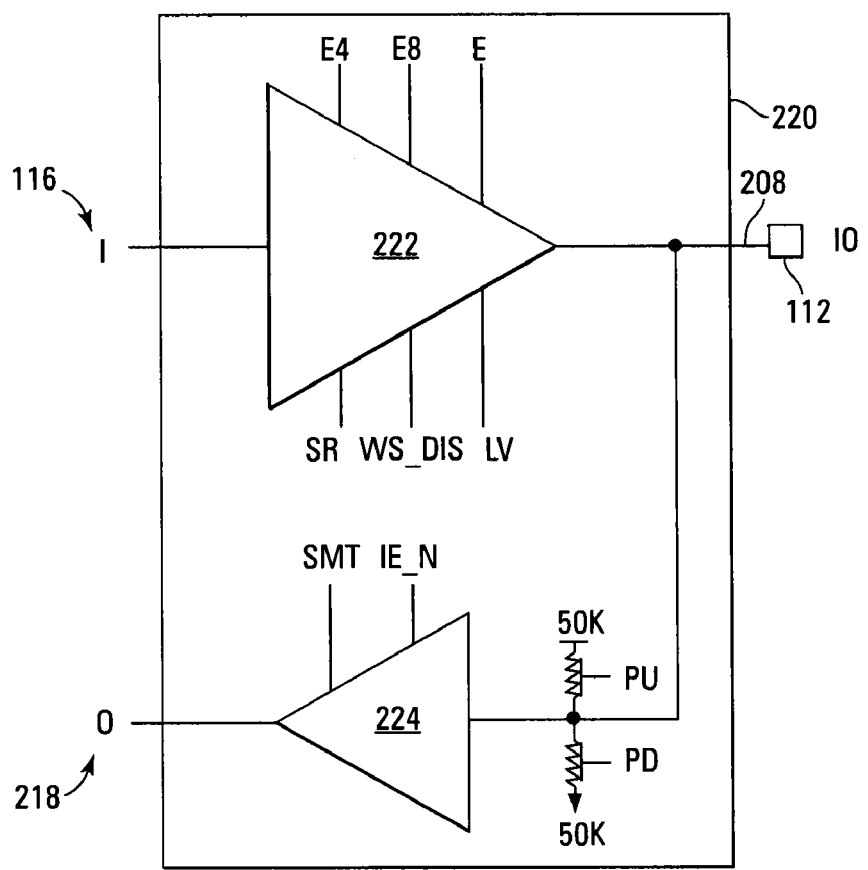
FIG. 2 is a diagram illustrating an exemplary adjustable I/O cell according to one embodiment of the I/O cell of the IC of FIG. 1.

FIG. 2 is a block diagram illustrating one I/O cell 220, which is an embodiment of I/O cell 120 depicted in greater detail. I/O cell 220 includes output driver circuit portion 222, which accepts as its input I signals fed via output signal path 116, and drives combined input/output node 208 that is connected to I/O pin 112. I/O cell 220 further includes input receiver circuit portion 224 that accepts as its input signals on combined input/output node 208, and produces a buffered output 0 that is connected to core logic 110 via input signal path 218 (not shown in FIG. 1) from core logic 110.

Both, output driver circuit portion 222, and input receiver circuit portion 224 have control inputs used to configure their respective operating modes. Input receiver circuit portion 114 has control bit SMT that enables/disables a Schmitt trigger circuit at the input. Control bit IE_N enables, or disables the input receiver circuit portion 224 by driving buffered output O to a high or low state. Configuration bits PU and PD each enables or disables pull-up and pull-down loads for combined input/output node 208.

Output driver circuit portion 222 includes enable control bit E that either enables output driver circuit portion 222, or sets the output of output driver circuit portion 222 to a high impedance state Z, as shown in Table 1 below.

TABLE 1

Output Driver Truth Table

| E | I | IO |
|---|---|----|
| H | H | H |
| H | L | L |
| L | X | Z |

Control bits E8 and E4 control the output drive strength of output driver circuit portion 222 as shown in Table 2 below.

TABLE 2

Output Driver Drive Strength Table

| E8 | E4 | Drive Strength |
|----|----|----------------|
| L | L | 4 ma (final value of Wave-Shape buffer) |
| L | H | 8 ma (initial drive value) |
| H | L | 12 ma (initial drive value) |
| H | H | 16 ma (initial drive value) |

Control bit SR selects wither a fast slew rate (rapid edge transitions), or a slow slew rate as shown in Table 3 below.

TABLE 3

Output Driver Slew Rate Table

| SR | Operation Mode |
|----|----------------|
| L | Fast |
| H | Slow |

Control bit LV selects an operation mode designed for either a 3.3 V power supply, or a 1.8 V power supply. The operation modes selected by control bit LV establish different drive characteristics of output driver circuit portion 222 for delivering the same output drive levels shown in Table 2 corresponding power supply voltage levels. For instance, in the 1.8 V operation mode, output driver circuit portion 222 is operated with lower output amplification stage impedance than in the 3.3 V operation mode. This may be accomplished in one embodiment by using a greater number of parallel driver transistors for the 1.8 V operation mode than for the 3.3 V operation mode. A number of other techniques may be employed to produce greater drive strength capability corresponding to the lower voltage operation mode. For example, an entirely different set of output driver transistors may be used for one power supply voltage mode or the other.

TABLE 4

Output Driver Voltage mode

| LV | Operation Mode |
|----|----------------|
| L | 3.3 v |
| H | 1.8 v |

The WS_DIS control bit turns on or off a waveshaping function, as shown in Table 5 below. The waveshaping function dynamically adjusts the output drive strength during the edge transitions to provide fast initial switching and slower switching as toward the end of the transition to suppress overshoot and ringing effects in situations where the load on the output driver circuit portion has certain reactive or transmission line characteristics that exacerbate such effects.

TABLE 5

Output Driver Waveshaping

| WS_DIS | Operation Mode |
|--------|----------------|
| L | Enabled |
| H | Disabled |

Figure 3:
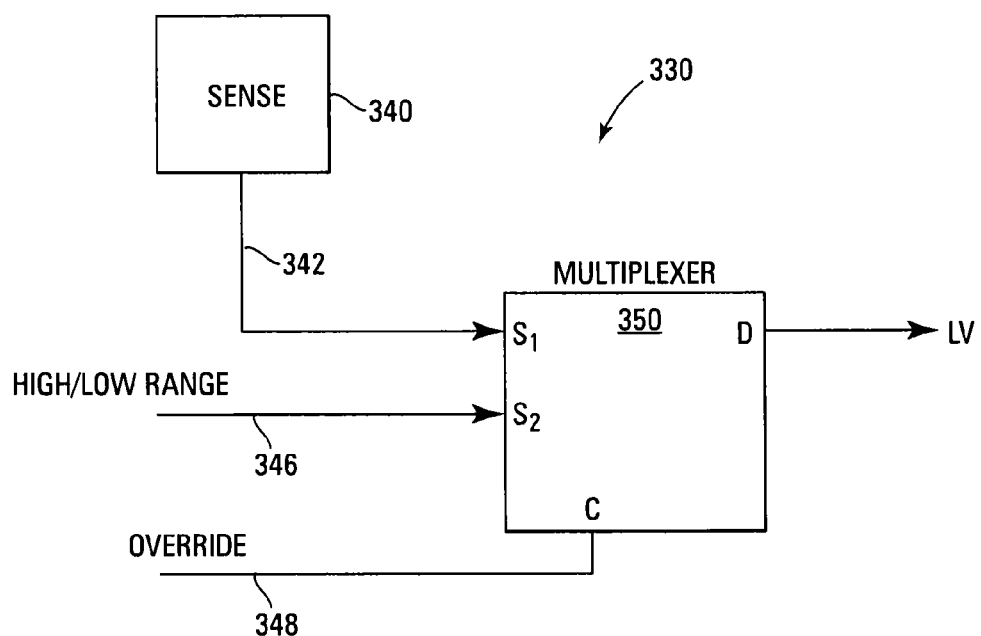
FIG. 3 is a diagram illustrating an exemplary I/O cell interface that operates with the I/O cell of FIG. 2 according to one embodiment of the invention.

FIG. 3 is a diagram illustrating an I/O cell control interface 330, which is one embodiment of I/O cell control interface 130. I/O cell control interface 330 interfaces with the LV control bit of I/O cell 220. Voltage sensor sub-circuit 340 determines whether the voltage of power supply 104 is at either 3.3 V or 1.8 V, and outputs a digital voltage indication 342 representing one or the other voltage. Conventionally, voltage sensor sub-circuit 340 feeds directly to the LV control input to output driver circuit portion 222 of I/O cell 220. In the present embodiment, however, multiplexer 350 selectively connects either digital voltage indication 342 to the LV control input (when input $S_1$ is selected), or an output drive strength high/low drive strength range control signal 346 (when input $S_2$ is selected). Voltage mode override signal 348 into MUX control input C selects between inputs $S_1$ and $S_2$. The selected MUX output at output port D feeds to the LV control input.

High/low drive strength range control signal 346 and voltage mode override signal 348 can be provided from core logic 110, from a programmable register or non-volatile memory circuit, or from an external source similarly to the way in which the other control inputs for configuring I/O cell 220 are provided. In a related embodiment, one or both of output drive strength high/low drive strength range control signal 346 and voltage mode override signal 348 are provided from different sources.

Table 6 below shows operation of I/O cell interface 330 to control the LV input based on the inputs to multiplexer 350.

TABLE 6

Truth Table for I/O Cell Interface

| Override | Drive Strength Range | Sense | LV |
|----------|----------------------|-------|----|
| L | X | L | L |
| L | X | H | H |
| H | L | X | L |
| H | H | X | H |

Figure 4:
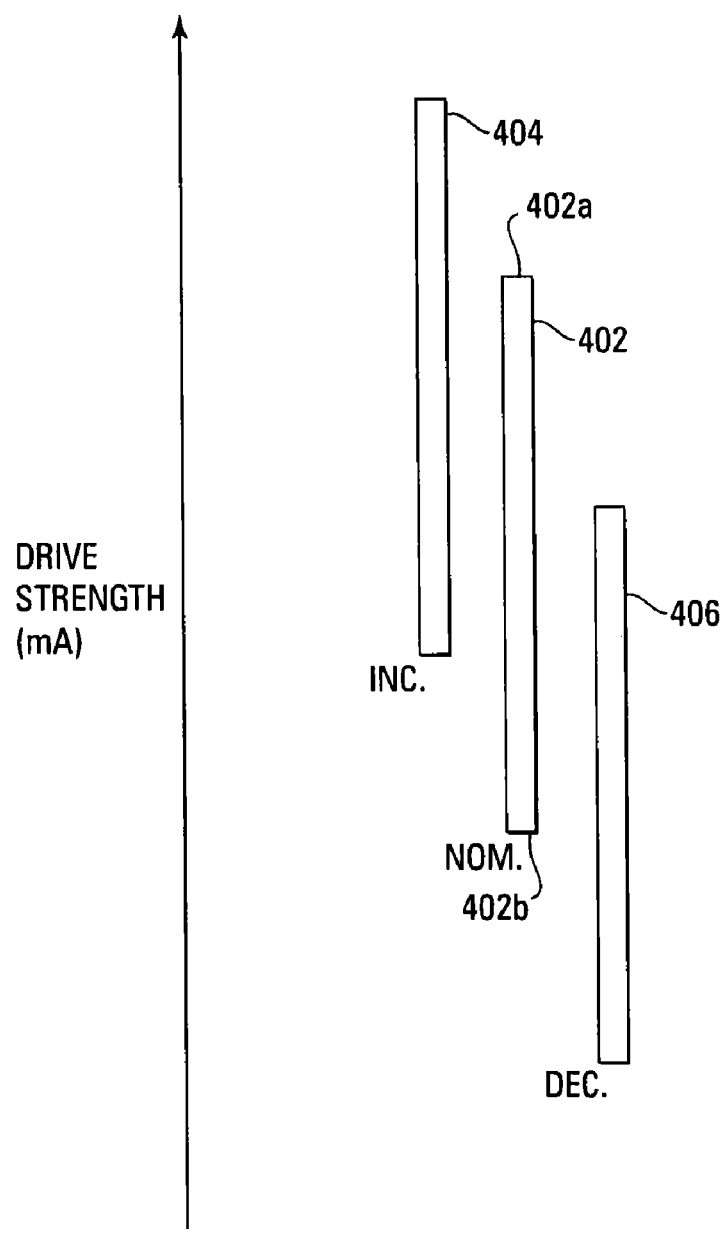
FIG. 4 is a diagram illustrating nominal and extended output drive strength ranges facilitated by aspects of the invention.

I/O cell control interface 330 permits an IC designer to adjust the available range of drive strength settings for I/O cell 220 under certain circumstances, as illustrated in FIG. 4. Nominal drive strength range 402 represents the range of drive strengths normally configurable, as shown in Table 2 above, including maximum nominal drive strength 402a and minimum nominal drive strength 402b. Increased drive strength range 404 may overlap with nominal drive strength range 402, but provides at least one drive strength setting higher than maximum nominal drive strength 402a under certain circumstances. Decreased drive strength range 406 may overlap with either nominal drive strength range 402 or increased drive strength range 404, but provides at least one drive strength setting lower than minimum nominal drive strength 402b under certain circumstances.

Table 7 below shows the various circumstances when range adjustment of output drive strength of output driver circuit portion 222 is available. For actual 1.8 V operation, the range for drive strength adjustment range can be decreased but not increased, whereas for actual operation at 3.3 V, the drive strength adjustment range can be increased but not decreased.

TABLE 7

Availability of Drive Strength Range Adjustment

| Actual Operating Voltage | Range Adjustment UP | Range Adjustment DOWN |
|---|---|---|
| 1.8 V | Unavailable | Available |
| 3.3 V | Available | Unavailable |

To increase the drive strength range when operating I/O cell 220 at 3.3 V, I/O cell 220 is essentially configured to operate in its mode corresponding to a 1.8 V supply. Similarly, to decrease the drive strength when operating I/O cell 220 at 1.8V, I/O cell 220 is essentially configured to operate in its mode corresponding to a 3.3 V supply.

In a related embodiment, high/low drive strength range control signal 346 and voltage mode override signal 348, along with control bits E8 and E4, are supplied by an output of a logic circuit that accepts as its input a drive strength signal control word having more than two bits. For example, in a situation where increased drive strength range 404 provides two drive strength settings beyond maximum nominal drive strength 402a, and where decreased drive strength range 406 provides two reduced drive strength settings below minimum nominal drive strength setting 402b, there are a total of 6 available drive strength settings within nominal range 402, among the 8 total available drive strength settings for a given actual operating voltage of IC 100. The logic circuit according to one embodiment converts a control word of 3 bits representing up to 8 drive strength settings, and generates high/low drive strength range control signal 346, voltage mode override signal 348, and control bits E8 and E4 in various combinations to provide a drive strength setting corresponding to the drive strength represented by the control word.

In another embodiment, the control logic can fit a combination of settings including the drive strength adjustments of the previous embodiment, together with the WS_DIS waveshaping control, to a drive strength control word.

The embodiments above are intended to be illustrative and not limiting. Additional embodiments are within the claims. In addition, although aspects of the present invention have been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An improved integrated circuit (IC) that includes an output driver circuit portion that is electrically configurable, via a set of configuration inputs including a power supply type indicator input facilitating input of an indication of a type of power supply being used to power the IC, and a drive strength control input facilitating electrical adjustment of drive strength of the output driver circuit portion within a range of adjustment corresponding to the indication of the type of power supply that is powering the IC, the improvement comprising:

a configuration interface circuit portion as part of the improved IC that is adapted to selectively override the power supply type indicator input such that the output driver circuit portion operates with an adjustable drive strength that is outside the range of adjustment corresponding to an actual type of power supply that powers the IC.

2. The improved IC of claim 1, wherein the output driver circuit portion is a part of an input or output (I/O) cell.

3. The improved IC of claim 1, wherein the power supply type indicator is an indication of a nominal power supply voltage type of the IC selected from at least two nominal voltage levels.

4. The improved IC of claim 1, wherein the configuration interface circuit portion operates to select a source for the configuration input from among at least an output of a supply voltage determining circuit and the drive strength control input.

5. The improved IC of claim 1, wherein the configuration interface circuit portion includes:

an output electrically coupled to the power supply type indicator input of the output driver circuit portion; and
at least a drive strength control input, a bypass input, and an override input; wherein:
when the override input is asserted, the drive strength control input is enabled and the bypass input is disabled; and
when the override input is not asserted, the drive strength control input is disabled and the bypass input is enabled.

6. The improved IC of claim 5, wherein the configuration interface circuit portion includes a 2×1 multiplexor circuit having first and second inputs and a MUX select input, wherein the first and second inputs are configured respectively as the drive strength control input and the bypass input, and wherein the MUX select input is configured as the override input.

7. The improved IC of claim 1, wherein the actual type of power supply that powers the IC is fixed by a hardware configuration of a circuit in which the IC operates.

8. The improved IC of claim 1, wherein when the output driver circuit portion operates with an adjustable drive strength that is outside the range of adjustment corresponding to an actual type of power supply that powers the IC, the output driver circuit portion operates with set of output drive characteristics that are outside of the predetermined range for which the output driver circuit portion has been designed.

9. An integrated circuit (IC) comprising:
an output driver circuit portion that includes:
means for electrically adjusting drive strength of the output driver circuit portion within a range of adjustment to produce a predetermined set of output drive characteristics for which the output driver circuit portion has been designed;
means for facilitating input of an indication of a type of power supply being used to power the IC, wherein the output driver circuit portion is configured to operate with the predetermined set of output drive characteristics when the indication of the type of power supply matches an actual type of power supply used to power the IC, the actual type of power supply being fixed by a hardware configuration of a circuit in which the IC operates; and
means for selectively overriding the means for facilitating input of an indication of a type of power supply, such that the means for electrically adjusting drive strength facilitate electrical adjustment of the drive strength outside of the range of adjustment to produce a new set of output drive characteristics that are outside of the predetermined range for which the output driver circuit portion has been designed.

10. An integrated circuit (IC) comprising:
an output driver circuit portion that includes a drive strength adjustment input and a power supply type indicator input distinct from the drive strength adjustment input;
wherein the drive strength adjustment input facilitates electrical adjustment of drive strength of the output driver circuit portion within a nominal range of adjustment corresponding to a predetermined set of output drive characteristics;
wherein the power supply type indicator input is configured to accept an indication of a type of power supply being used to power the IC, and wherein the output driver circuit portion is configured to operate with the predetermined set of output drive characteristics when the indication of the type of power supply matches an actual type of power supply used to power the IC; and
an override circuit electrically coupled to the power supply type indicator input, the override circuit configured to maintain a set value at the power supply type indicator input regardless of the actual type of power supply that may power the IC, thereby configuring the output driver circuit portion to be adjustable, via the drive strength adjustment input, to produce a drive strength characteristic that is beyond the set of output drive characteristics corresponding to the nominal range of adjustment when the actual type of power supply does not correspond to the set value at the power supply type indicator input.

11. The IC of claim 10, wherein the output driver circuit portion is a part of an input or output (I/O) cell, and the override circuit is not part of that I/O cell.

12. The IC of claim 10, wherein the indication of the type of power supply being used to power the IC is set from among a relatively low nominal supply voltage indication and a relatively high nominal supply voltage indication.

13. The IC of claim 10, wherein the type of power supply actually powering the IC is fixed by a hardware configuration of a circuit in which the IC operates.

14. The IC of claim 10, wherein the IC is configured to provide a drive strength characteristic that is greater than an upper limit of the set of output drive characteristics, wherein the override circuit configured to maintain a value at the power supply type indicator input corresponding to a minimum power supply voltage for which the output driver circuit is designed.

15. The IC of claim 10, wherein the IC is configured to provide a drive strength characteristic that is less than a lower limit of the set of output drive characteristics, wherein the override circuit configured to maintain a value at the power supply type indicator input corresponding to a maximum power supply voltage for which the output driver circuit is designed.

16. In an integrated circuit (IC) having an output driver circuit portion that includes a drive strength adjustment input facilitating electrical adjustment of drive strength of the output driver circuit portion within a range of adjustment to produce a predetermined set of output drive strength characteristics for which the output driver circuit portion has been designed, and a power supply type indicator input facilitating input of an indication of a type of power supply being used to power the IC, a method for configuring a drive strength of the output driver circuit portion, the method comprising:
electrically configuring the output driver circuit portion to operate outside of the range of adjustment to produce a new set of drive strength characteristics that are beyond the output drive strength characteristics for which the output driver circuit portion has been designed, including configuring the power supply type indicator input to a set value regardless of the actual power supply type being used to power the IC, wherein the electrically configuring is based on a desired drive strength for the output driver circuit portion.

17. The method of claim 16, wherein configuring the power supply type indicator input to a set value includes setting the power supply type indicator input to represent a type of power supply that supplies a minimum supply voltage for which the output driver circuit portion was designed, wherein that configuring of the power supply corresponds to a desired drive strength that is a maximum drive strength for the output driver circuit portion.

18. The method of claim 16, wherein configuring the power supply type indicator input to a set value includes setting the power supply type indicator input to represent a type of power supply that supplies a maximum supply voltage for which the output driver circuit portion was designed, wherein that configuring of the power supply corresponds to a desired drive strength that is a minimum drive strength for the output driver circuit portion.

* * * * *